(12) United States Patent
Guziak

(10) Patent No.: US 11,264,193 B2
(45) Date of Patent: Mar. 1, 2022

(54) TWO WIRE PRESSURE INDICATING SWITCH WITH ALL ELECTRONIC ARCHITECTURE WITH MILLIVOLT OPERATING SUPPLY

(71) Applicant: Hydra-Electric Company, Burbank, CA (US)

(72) Inventor: Robert Andrew Guziak, Thousand Oaks, CA (US)

(73) Assignee: HYDRA-ELECTRIC COMPANY, Burbank, CA (US)

( * ) Notice: Subject to any disclaimer, the term of this patent is extended or adjusted under 35 U.S.C. 154(b) by 123 days.

(21) Appl. No.: 16/859,858

(22) Filed: Apr. 27, 2020

(65) Prior Publication Data

US 2021/0335563 A1    Oct. 28, 2021

(51) Int. Cl.
*G01L 5/1623* (2020.01)
*H01H 35/24* (2006.01)
*G01L 27/00* (2006.01)

(52) U.S. Cl.
CPC ........... *H01H 35/24* (2013.01); *G01L 5/1623* (2020.01); *G01L 27/007* (2013.01)

(58) Field of Classification Search
CPC .............................. H01H 35/24; G01L 5/1623
See application file for complete search history.

(56) References Cited

U.S. PATENT DOCUMENTS

| | | |
|---|---|---|
| 5,528,940 A | 6/1996 | Yamamoto et al. |
| 9,680,324 B2 * | 6/2017 | Wiley ................ H02J 50/00 |
| 2016/0258639 A1 | 9/2016 | Wiley et al. |
| 2018/0159311 A1 | 6/2018 | Guziak |
| 2018/0172766 A1 | 6/2018 | Guziak |

FOREIGN PATENT DOCUMENTS

WO    2008055403 A1    5/2008

OTHER PUBLICATIONS

International Search Report and Written Opinion for PCT/US21/29301, dated Aug. 4, 2021.

* cited by examiner

*Primary Examiner* — Vanessa Girardi
(74) *Attorney, Agent, or Firm* — Concept IP LLP; Michael Zarrabian

(57) ABSTRACT

Systems, devices, and methods for a two wire detection circuit powered system comprising: an electronic switch circuit configured to sense a pressure level above or below a predetermined value and indicate an open or closed switch condition, wherein the electronic switch circuit provides a contact resistance voltage of about 20 mV in the closed switch condition; and an energy harvester configured to convert 20 mV when the electronic switch circuit is in the closed switch condition to an operating voltage between 3.6 Volts and 5 Volts for the electronic switch circuit to operate without an additional power source.

14 Claims, 5 Drawing Sheets

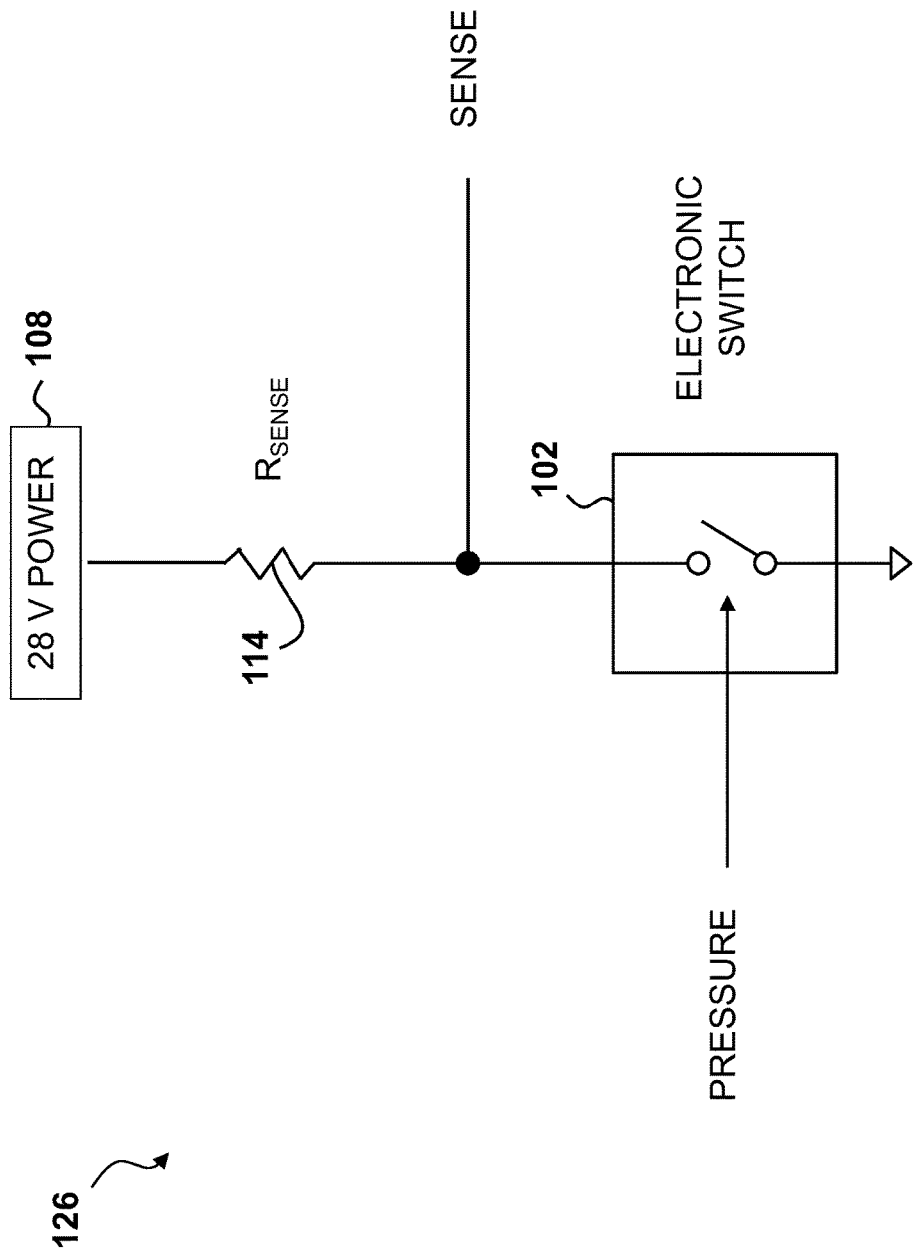

TWO WIRE PRESSURE INDICATING SWITCH WITH ALL ELECTRONIC ARCHITECTURE WITH MILLIVOLT OPERATING SUPPLY

TECHNICAL FIELD

Embodiments relate generally to a pressure indicating switch, and more particularly to a two wire pressure indicating switch.

BACKGROUND

A mechanical pressure switch converts the pressure of a fluid, a gas, or a flow of a fluid or gas into a mechanical movement that actuates a mechanical microswitch contact to electrically indicate the presence or absence of a pressure level. Pressure switches are found in automotive, trucking, aircraft, and industrial applications where levels of pressure are required to perform some action, indicate a safety condition, or provide a means of control. Pressure switches typically consist of a two state mechanical spring mechanism that performs a snapping action at a preset pressure level, where the snapping action activates an electrical contact which can be used to sense the state of the pressure.

Commercially available pressure switches may be found that use a cantilevered micro switch that requires a force to activate, and returns to an initial state when the force is removed. Other mechanisms of sensing pressure may be through the use of two state spring washers, sometimes referred to as negative rate disk springs. Another mechanism for sensing pressure is through the use of ball detent systems, or simple linear spring measurement systems that trigger electrical contact closure.

SUMMARY

A system embodiment may include: a monitored operation such as a hydraulic actuator, a filter pressure drop indication, a pressurized fuel system or an oil pressure monitor. The sense of a pressure level above or below a predetermined value that is indicated by the switch open or switch closed condition is useful to the operation or safety monitoring of the system. An example of a useful monitored system having two states is an engine air intake filter. A clean filter has little obstruction to the flow of air resulting in a low pressure drop across the filter. As a filter gathers contaminants from the flow of air across the filter element, resistance to flow increases causing a pressure drop across the filter. Sensing this restricted flow and increasing pressure drop across the filter a pressure switch can be used to indicate a threshold where a new filter element should be installed.

A two wire detection circuit powered system may include: an electronic switch circuit configured to sense a pressure level above or below a predetermined value and indicate an open or closed switch condition, where the electronic switch circuit provides a contact resistance voltage of about 20 mV in the closed switch condition; and an energy harvester configured to convert 20 mV when the electronic switch circuit may be in the closed switch condition to an operating voltage between 3.6 Volts and 5 Volts for the electronic switch circuit to operate without an additional power source.

In additional two wire detection circuit powered systems, the electronic switch circuit may further include: a pressure sensing device configured to sense the pressure level and generate a sense element signal indicating the sensed pressure level; a comparator device configured to receive the sense element signal from the pressure sensing device and generate a control signal, where the control signal indicates the detected pressure level as higher or lower than a preset threshold; and an electronic pressure switch configured to receive the control signal from the comparator device, where the electronic pressure switch may be turned on or off based on the control signal, and where power may be derived from a sense circuit.

In additional two wire detection circuit powered systems, the operating voltage from the energy harvester comprises a regulated rail to the comparator device and a regulated voltage to the pressure sensing device. In additional two wire detection circuit powered systems, the regulated rail may be between 0.5 Volts and 1.5 Volts. In additional two wire detection circuit powered systems, the regulated voltage may be between 3.6 Volts and 5 Volts.

Additional two wire detection circuit powered systems may include: a front end of the energy harvesting conversion device, where the front end lowers voltage delivered to the energy harvesting conversion device to lower voltage to safe operating levels and simulate an open mechanical switch contact. Additional two wire detection circuit powered systems may include: a sense voltage detection feed; and a voltage limiter, where the voltage limiter limits a voltage supplied to the energy harvesting conversion device to lower voltage to safe operating levels and simulate an open mechanical switch contact. In additional two wire detection circuit powered systems, the front end and the voltage limiter limit a voltage going into the energy harvester to a maximum of 5 Volts.

Additional two wire detection circuit powered systems may include: a power supply; an external sense resistor connected between the power supply and the electronic pressure switch; and a series resistor connected between the external sense resistor and the electronic pressure switch, where the series resistor simulates a closed state of a switch, and where a ratio of the external sense resistor to the series resistor provides a low impedance to simulate a mechanical two wire sense system while deriving power from a sense circuit. In additional two wire detection circuit powered systems, the pressure sensing device may be a transducer that converts a pressure into at least one of: a voltage, a capacitance change, and a resistance change. In additional two wire detection circuit powered systems, the pressure sensing device may be a transducer with an amplifier.

In additional two wire detection circuit powered systems, the comparator device comprises a preset hysteresis allowing preset hysteresis based on ascending or descending detected pressure levels. In additional two wire detection circuit powered systems, turning the electronic pressure switch on outputs a low impedance, and where turning the electronic pressure switch off outputs a high impedance while deriving power from a two wire detection system through a sense circuit and low voltage conversion. In additional two wire detection circuit powered systems, the electronic pressure switch may be a transistor coupled to a two wire sense circuit which also provides the excitation.

BRIEF DESCRIPTION OF THE DRAWINGS

The components in the figures are not necessarily to scale, emphasis instead being placed upon illustrating the principals of the invention. Like reference numerals designate corresponding parts throughout the different views. Embodiments are illustrated by way of example and not limitation in the figures of the accompanying drawings, in which:

FIG. 1A depicts a pressure sensing system with an electronic switch, according to one embodiment;

DETAILED DESCRIPTION

Figure 1B:
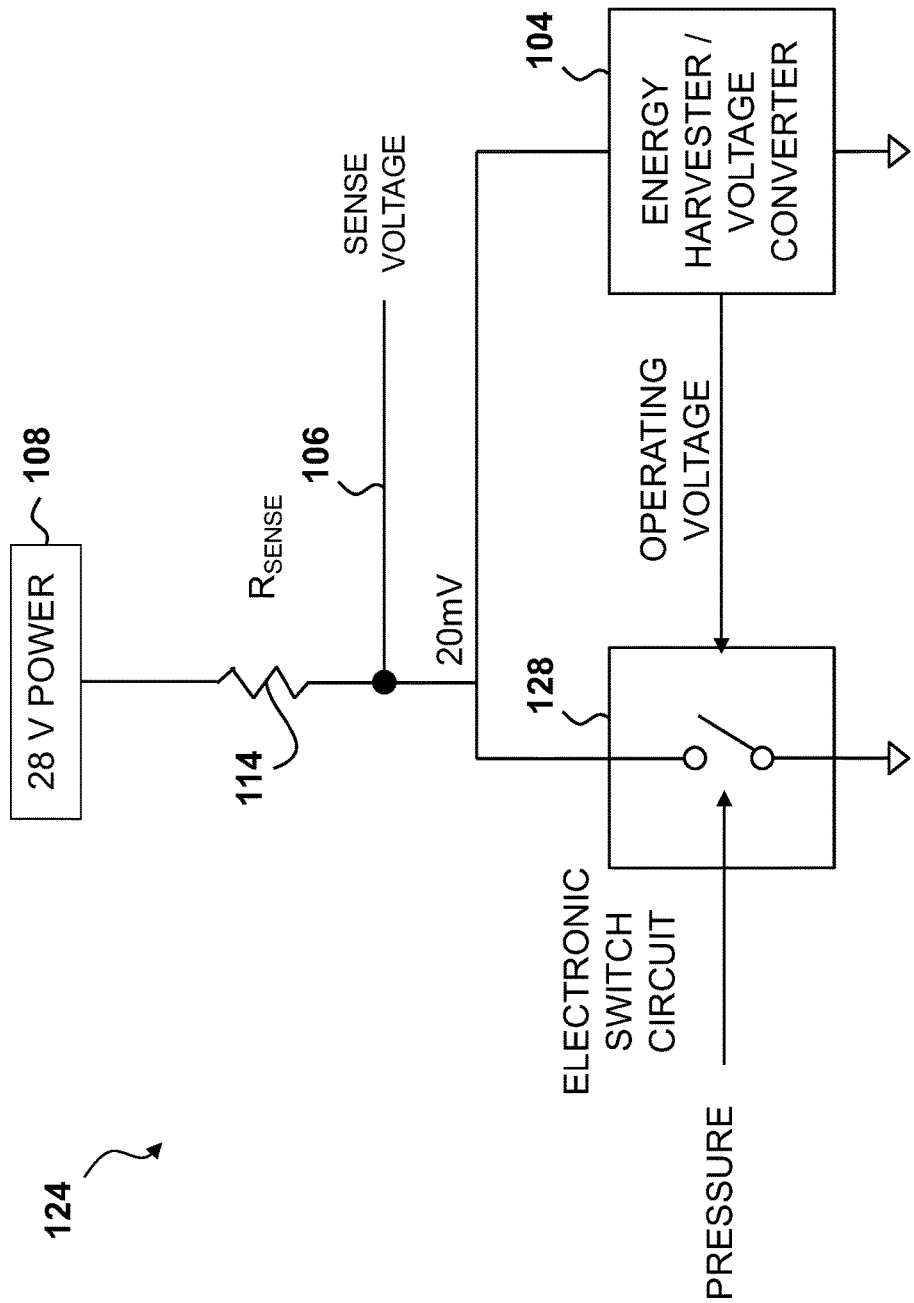
FIG. 1B depicts a two wire pressure sensing circuit, according to one embodiment

The system and method disclosed herein may be used to replace a mechanical pressure switch with an all-electronic switch. The all electronic switch may differ from other electronic pressure switches by providing detection and operating current through a two wire circuit used by mechanical switches.

In a detection circuit, voltage and current are fed from a source through a resistor that feeds the electronic switch. The electronic switch when open draws minimal or no current thus having minimal or no voltage drop across a sense resistor. When the electronic switch is closed by sensing predetermined pressure levels, the maximum current passes through the sense resistor resulting in near zero voltage at the switch to ground or power return or full power supply voltage drop across the sense resistor.

The system and method disclosed herein does not use a third wire to supply operating power to the electronic circuit. The system and method disclosed herein utilizes a near zero voltage across the internal switch simulation circuit to fully drive the electronic switch by converting a small millivolt level to a higher useful level that powers the electronic switch.

Mechanical switches, especially as used in aircraft and aerospace applications, are ubiquitous in applications where pressure indication is required for sequencing proper operation, indicating status of filters, or providing a means of alarming safety critical conditions. Such conditions include insufficient hydraulic pressure to operate equipment, low or sufficient fuel levels, oil pressure levels for an engine, fuel levels, or cabin air pressure threshold.

The pressure switch may provide a mechanical micro switch with an open or closed state to indicate a pressure level. Open or closed conditions are selected by an application to provide the proper notification (e.g., positive logic or negative logic, as needed). A switch may operate with a 28 Volt circuit that passes through a sense resistor. In one embodiment, 3K ohms are passed into a switch.

An open switch offers a high impedance to the 28 Volt line where the voltage drop across the resistor will be zero, indicating 28 Volts at the junction of the resistor to the switch.

A closed switch provides approximately zero ohms to the 28 Volt return. The junction of the resistor to the switch drops all, or nearly all, of the 28 Volts showing a closed contact sense voltage of zero Volts or nearly zero Volts.

Mechanical switches that perform this function are susceptible to environmental effects, wear, contamination, and failure modes due to the nature of the mechanical operation. Wear can occur during repeated operation of opening and closing the switch as the mechanical contacts contact and break. The mechanical contact may experience sliding wear as the switch opens and closes. The mechanical switch may experience wear due to weld discharge as the electrical current makes and breaks flow. Degraded contact resistance may also be seen due to effects of outgassing materials depositing on the contact.

Mechanical switch contact resistance may also increase due to vibration on the contact. The spring, activation mechanisms, and contacts may be affected by the force of vibration that causes the elements to move in response to the forces leading to friction wear.

Mechanical switches typically operate through the use of a two state mechanical spring. Force collectors, such as diaphragms couple force to the spring, which snaps and deflects on reaching a level of force previously designed for the spring to reach. With force decreasing, the spring snaps back to the original position. Switches typically have a hysteresis between the increasing pressure snap point and the decreasing pressure snap point for the purpose of avoiding oscillation during switching a slowly changing pressure.

Generally speaking, pressure switches are devices used to indicate, with two electrical states, the status of a media pressure above a pressure range or below a pressure range with increasing and decreasing hysteresis. Pressure switches may be used in applications in addition to aerospace, such as cars, boats, airplanes and other equipment where information about the pressure levels is used to insure proper operation or to indicate an alarm condition.

As described above, the mechanical switch may operate when a mechanical spring is triggered by a pressure threshold for an ascending pressure increase or decreasing pressure at set trigger levels. The mechanical switch closes for increasing current flow or opens for decreasing current flow. These current flows cause a voltage drop across a sensing resistor that indicates the absence or presence of the indicating pressure level.

The switch closure may be susceptible to degradation, which changes the current draw and the indicating voltage level. The switch closure is also subject to transient conditions, such as contact chatter during vibration or shock. In addition, the mechanical mechanisms that activate the micro switch are subject to wear, temperature effects, aging, and property changes over usage.

System embodiments disclosed herein address effects of aging, wear, parameter change with usage, chatter with vibration and shock, alteration with temperature, and increasing contact resistance. Furthermore, system embodiments disclosed herein may provide for eliminating false indications primarily of an open state due to functional degradation of the component parts, and to provide a means of improving accuracy of the switch indication pressure points initially, through time and through operation.

Embodiments described herein may include electronics to provide solutions to mechanical wear, eliminate environmental effects, and to provide increased precision.

To enable pressure switches to take advantage of the use of precision electronics in place of mechanical components has previously been prevented by the limitation of available voltage in two wire systems. When the mechanical switch is closed, the contact resistance presents a low impedance, which for the typical current level drawn through the sense resistor (e.g., 28 volts/3K sense resistor or 9.3 milliamps) produces a low voltage drop across the closed switch in the range of millivolts. This voltage is typically too low to allow electronics to operate.

The present system utilizes an energy harvesting component capable of converting very low levels of voltage, such as 20 mV into higher voltages. This form of operation does not use the energy harvesting component in its typical configuration where an external energy source, such as a thermocouple, a sound transducer, or a kinetic voltage generator is the source of power. Rather, the present system utilizes an electronic switch, such as a transistor in place of the mechanical switch to provide a constant low impedance to the current flow. This low simulated contact impedance is sufficient to generate voltage levels such as 20 mV which can be converted to higher voltages, such as 3.6 Volts or 5 Volts by the energy harvesting device to power the electronics.

With the constant supply of power to the simulated two wire mechanical switch, the electronic circuits can be powered even when the low simulated contact impedance produces a minimal voltage drop. The present system also protects the electronics from high voltages, such as the open circuit 28 Volts or transients that may appear on the 28 Volts sense line due to inductive spikes, external generated transients, or effects of Electro-Magnetic Interference.

The present system also includes a circuit that operates as a high impedance limiter to keep voltage delivered to the electronics and the energy harvesting device at a safe level and appear as an open switch contact.

Most existing mechanical switch configurations are two wire without separate power supply. An all-electronic solution consisting of just a two wire connection may be used as a high-reliability replacement for an existing mechanical switch. Operation without a separate power supply simplifies the wire interconnect and eliminates the need for a separate power supply. A third or fourth wire configuration would require a larger interconnect system such as a connector or cable. Elimination of the need of additional wires to carry power also reduces the weight of cables, the sizes of cables and the cost of additional wires. Eliminating one or two wires for a separate power supply also increases reliability of interconnect.

With respect to FIG. 1A, a pressure sensing system 126 with an electronic switch is illustrated. The pressure sensing system 126 includes a 28V power supply 108 and an outside sense resistor 114. An electronic switch 102 acts like a mechanical switch to trigger a pressure level above or below a predetermined value. The electronic switch 102 turns 'on' or 'off' based on the pressure level.

With respect to FIG. 1B, a two wire pressure sensing circuit 124 is illustrated. The two wire pressure sensing circuit 124 of FIG. 1B is shown in further detail in FIG. 1C. The two wire pressure sensing circuit 124 includes a 28V power supply 108, an outside sense resistor 114, a sense voltage 106, an energy harvester or voltage converter 104 and an electronic switch circuit 128.

Figure 1C:
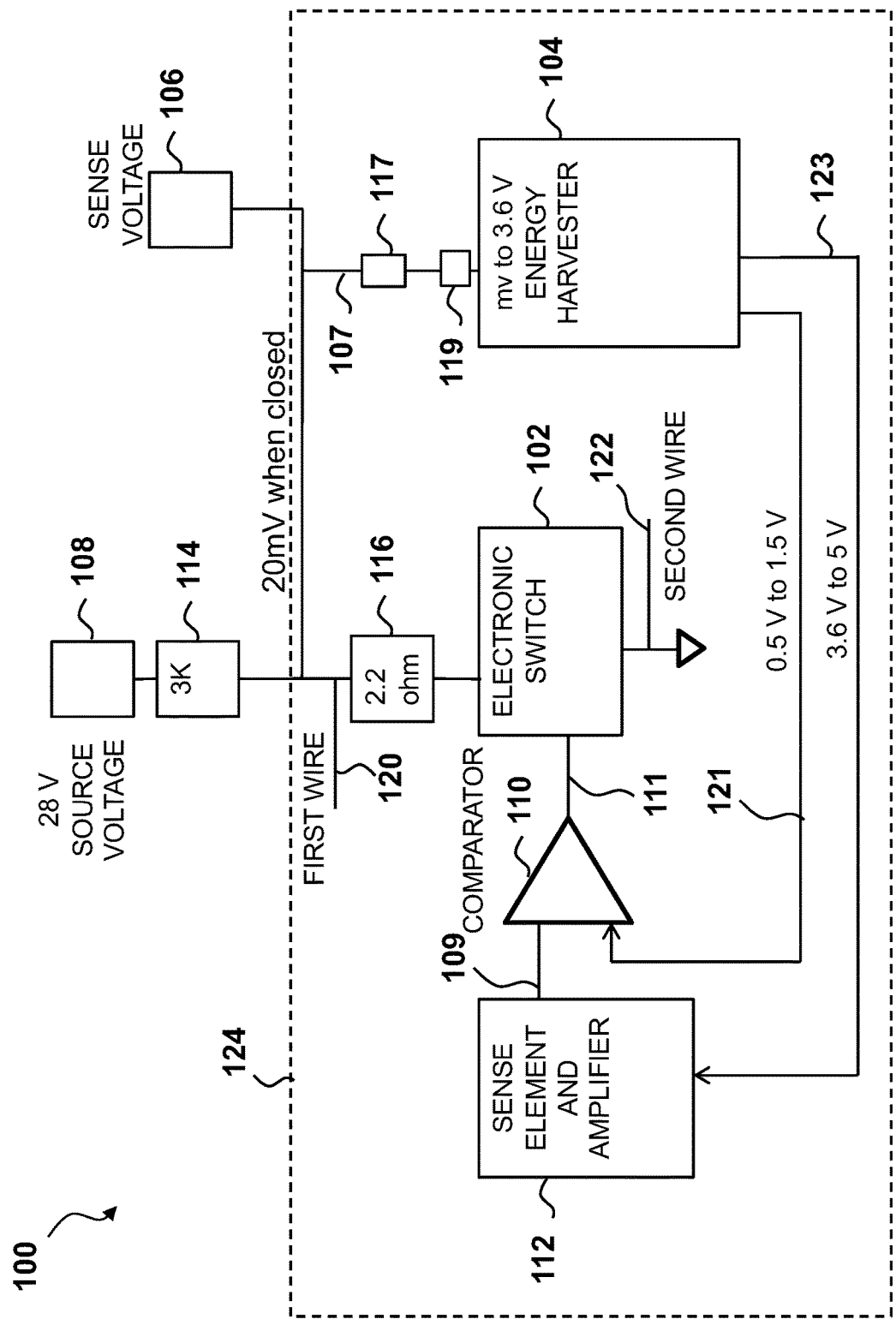
FIG. 1C depicts a two wire pressure sensing system with a two wire pressure switch, according to one embodiment.

The electronic switch circuit 128 may include an electronic switch 102, a sense element signal 109 which indicates the pressure level, a comparator 110, and series second resistor 116 with a contact resistance voltage in the range of 20 mV, as shown in FIG. 1C.

The electronic switch circuit 128 and energy harvester or voltage converter 102 receive 20 mV from the power supply 108 through the sense resistor 114 when the electronic switch circuit 128 is closed. The energy harvester or voltage converter 104 supplies operating voltage to the electronic switch circuit 128 such that an additional power source is not required to power the electronic switch circuit 128. As an additional power source is not required, the two wire pressure sensing circuit 124 may replace a mechanical switch directly, i.e., without needing to add a power source to power the two wire pressure sensing circuit 124 itself.

The two wire pressure sensing circuit 124 emulates a mechanical switch. The two wire pressure sensing circuit 124 may directly replace a mechanical switch without the need for a separate power source to power the electronic components of the two wire pressure sensing circuit 124.

When a typical mechanical switch is closed, the mechanical switch may have about 50-100 mOhms of resistance. When the electronic switch circuit 128 is closed, about 20 mV is provided. Accordingly, 20 to 100 mV between the 28 Volt power source 108 and the return is sufficient to provide an indicator that the switch is closed. This level of voltage developed corresponds to 10 Ohms or less for the second resistor (116 in FIG. 1C) and the electronic switch (102 in FIG. 1C) in the electronic switch circuit 128 to indicate that the switch is closed. If there is 10 Ohms or less then a certain voltage drop would be about 50 mV, which is sufficient more than needed for the electronic energy harvesting switch circuit to operate.

In one embodiment, the second resistor (116 in FIG. 1C) may be 2.2 Ohms to provide around 20 mV. In that closed switch configuration, 20 mV is generated. The two wire pressure sensing circuit 124 may be tuned to provide a minimum voltage required to operate while still providing a signal that appears as a mechanical switch closed contact. In some embodiments, 20 mV may be the minimum voltage. The circuit 124 may be tuned so that there is 20 mV and no greater than 10 Ohms.

The energy harvesting device 104 may then be used to convert the available 20 mV into a more useable range of 3.6 Volts to 5 Volts. The pairing of tuning to 2.2-10 Ohms for the second resistor (116 in FIG. 1C) with the energy harvester (104) derives the power. This power from the energy harvester can be used to power the electronic components in the electronic switch circuit in order to simulate an ideal mechanical switch.

With respect to FIG. 1C, a two wire pressure sensing system 100 with a two wire pressure switch for indicating a pressure is illustrated. The pressure sensing system 100 may be connected to an external sense resistor 114 and an external power supply 108. The power supply 108 may be a 28 Volts source voltage. The pressure sensing system 100 may also require no additional external power input to power the circuitry. The pressure sensing system 100 may use the normal switch position detection voltage to power the pressure sensing system 100.

The two wire pressure sensing system 100 may indicate the state of the pressure through a two wire, open high impedance or closed, low impedance (e.g., several ohms) condition. The two wire circuit may include a first wire 120 and a second wire 122. The two wire pressure sensing system 100 may replicate the operation of a two wire mechanical pressure indicating switch where a sense voltage detection feed 106 indicates a predetermined pressure level. A typical mechanical switch indicates one pressure level through a normally closed micro switch operating at a range of mOhms to several Ohms of contact resistance. An open contact or high impedance indicates a different pressure or range of pressures.

In one embodiment, the two wire pressure sensing system 100 detects a pressure level through the use of a pressure sensing element 112, such as a silicon MEMS element, a thin film pressure sensing element, or similar technology. When sense element signal levels of the pressure sensing element 112 are insufficient for further processing, an amplifier may be used to boost the signal.

In one embodiment, the pressure sensing element 112 may be a transducer that converts an applied force or pressure into a voltage, capacitance change, resistance change or other conversion means. In another embodiment, the sensing element 112 may be a transducer with an amplifier. In other embodiments, the sensing element 112 may also be applied to other measurements, such as temperature and fluid or gas flow. In one embodiment, the transducer passes a sense element signal 109 indicating the pressure level to the comparator 110.

A sense element signal 109 of the pressure sensing element 112 passes into an electronic comparator circuit 110 that is set to detect a specific pressure range. The electronic comparator circuit 110 provides a control signal 111 to the electronic switch circuit 102 that operates as an open contact or a closed contact. In an alternative embodiment, a resistance temperature detector (RTD) may be used to provide a temperature switch operation rather than a pressure detection. In one embodiment, the RTD circuitry may perform the same signal management as that described above with only a sensor signal being generated, where the sensor signal may have a temperature indicating device rather than a pressure indicating device.

The comparator 110 provides a logic indication of the pressure level being higher or lower than a preset threshold. The comparator 110 may have a preset hysteresis allowing preset hysteresis based on ascending or descending pressure levels. This hysteresis is typically included to prevent oscillations around the switch points for slowly moving changes in pressure.

A logic level in the control signal 111 may be passed from the comparator 110 to the electronic switch 102. The control signal 111 controls the state of the electronic switch 102 to be either on or off depending on the application requirement.

The electronic switch 102 may operate as a mechanical switch simulator where the "on" condition is low impedance and the "off" condition is high impedance. In one embodiment, the electronic switch 102 is a transistor that turns on to simulate the low contact resistance in conjunction with the series second resistor 116 with a contact resistance voltage in the range of 20 mV. When the electronic switch 102 is turned off, the electronic switch 102 operates as an open circuit or high impedance. In some embodiments, the electronic switch 102 may be a transistor, an integrated circuit, or any device that turns on and off and draws current.

In one embodiment, the two wire pressure sensing system 100 has an energy harvesting conversion circuit 104. The energy harvesting conversion circuit 104 is typically used to take voltage from a low millivolt level energy harvesting application. The use of an energy harvesting conversion circuit 104 to derive power from such a low voltage level may allow the pressure sensing system 100 to simulate a low contact resistance (e.g., typically less than 10 ohms) mechanical switch. The open circuit operation draws a low level of current in order to simulate a high impedance mechanical switch in the open condition.

Integrated circuits may be used as voltage converters to convert very lower voltages to higher voltages. Transistors in these integrated circuits can be made to operate to very low voltages, such as 20 mV. These transistors can be used to drive a transformer in the integrated circuits. When the transistor in the integrated circuit is turned on, the transistor draws current from the 20 mV that is present. When the transistor is turned off it creates a large voltage spike, called a "flyback". This flyback converts 20 mV into 3.6 Volts or 5 Volts.

The energy harvester or voltage converter 104 uses an integrated circuit to convert 20 mV into 3.6 Volts or 5 Volts using the process described above. The energy harvester or voltage converter 104 may also include a voltage regulator to sense when it is at the set level of 3.6 Volts to 5 Volts.

In some embodiments, energy harvesters may be paired with one or more thermocouples to generate short, e.g., 10 seconds, of mVs of output. In other embodiments, energy harvesters may be paired with small piezo microphones that will pick up acoustic vibrations. These acoustic vibrations form low amount of voltage that are input into the energy harvester to act as an energy source.

In the two wire pressure sensing system 100, when the electronic switch 102 is closed there may only be 20 mV of available power from the 28V source voltage power source 108. The use of an energy harvester to provide power itself may not be feasible or reliable in certain situations, such as a switch in an aircraft. However, the 28V from the power source 108 is always available and can be used in the system to provide power to the electronic components that would replace a mechanical switch. Specifically, the energy harvester 104 can use the available 20 mV when the electronic switch 102 is closed to convert that energy into higher voltages that can use standard components (e.g., the sense element and amplifier 112, comparator 110, and electronic switch 102) through the rest of the circuit. The two wire pressure sensing circuit 124 receives power from the closed electronic switch 102 via the energy harvester 104.

The outputs 121, 123 of the energy harvester 104 are provided to the comparator 110 and the sense element and amplifier 112. A regulated voltage 123 is the power that drives the sense element and amplifier 112. The regulated voltage 123 may be 3.6 Volts in some embodiments. The regulated voltage 123 may be 5 Volts in some embodiments. In some embodiments, the regulated voltage 123 may be between 3.6 Volts and 5 Volts.

A voltage reference 121 is generated for the comparator circuit 110. The voltage reference 121 may be between 0.5 Volts and 1.5 Volts. In some embodiments the sense resistor 114 may be between 1.5K and about 3K. The resistance of the sense resistor 114 may be chosen in order to establish 20 mV when the electronic switch 102 is closed and about 28 Volts when the electronic switch is open. These values may correspond to a mechanical switch. The regulated voltage 123 and voltage reference 121 are derived from the 20 mV by the energy harvester 104 in order to drive the electronic components of the circuit 124.

In some embodiments, the two wire pressure sensing circuit 124 may include a front end 119 and a voltage limiter 117. The voltage limiter 117 may provide an additional impedance when the electronic switch 102 is open and there is no voltage drop across the sense resistor 114 and the sense voltage 107 is around 28 Volts. In some embodiments, the voltage limiter may be a part of the energy harvester 104.

In some embodiments, the energy harvesting device 104 may not operate above 5 Volts and so too much voltage across the energy harvester 104 may cause burn out. The front end 119 and voltage limiter 117 may limit a voltage going into the energy harvester 104 when the electronic switch 102 is open such that the voltage going into the energy harvester 104 never goes above 5 Volts. In one embodiment, the voltage limiter 117 may limit the voltage into the energy harvester 104 by selectively turning off current to limit voltage in to the energy harvester 104 to 5 Volts. At the same time, the impedance may increase to appear as an open circuit.

Sense voltage 106 is a point to detect the voltage. The sense voltage 106 may be used to couple into an outside system that is detecting the voltage levels.

In one embodiment, the two wire pressure sensing system 100 may not require mechanical components that open or close a mechanical switch, e.g., it is all electronic. In one embodiment, the two wire pressure sensing system 100 has a near infinite switching life as opposed to a limited switching life for a mechanical design. In one embodiment, the two wire pressure sensing system 100 may be unaffected by vibrations. In one embodiment, the two wire pressure sensing system 100 has a smaller physical size with electronic components as compared to a mechanical switch with mechanical components. In one embodiment, the two wire pressure sensing system 100 has a reduced weight as compared to a mechanical switch. In one embodiment, the two wire pressure sensing system 100 has a weight in the range of 2-4 ounces. In one embodiment, the two wire pressure sensing system 100 has common components for multiple designs. In one embodiment, the two wire pressure sensing system 100 is capable of having multiple switch point indications using a common sense element, common energy converter circuit, and separate switching circuitry.

In one embodiment, the two wire pressure sensing system 100 may have no moving parts, no mechanical adjustments, and no wear of components that degrades contact resistance. In one embodiment, the two wire pressure sensing system 100 uses components that have inherent higher reliability than the moving mechanical parts. In one embodiment, the two wire pressure sensing system 100 provides for tighter control of accuracy and may maintain accuracy over conditions of changing temperature, vibration, acceleration, and aging.

In one embodiment, the two wire pressure sensing system 100 may perform closed-loop calibration through a computer interface that programs, selects, or adjusts the settings for switching through an electronic means.

In one embodiment, the two wire pressure sensing system 100 may also include a sense voltage detection feed 106, a source voltage 108, a first resistor 114, and a second resistor 116. The energy harvesting circuit 104 may operate with sub-threshold, field effect transistors (FETs) to boost voltages in the two wire pressure sensing system 100. In one embodiment, the voltages may be boosted from approximately in the range of 20 mV to an output of several volts useable to drive the internal electronic circuits. In one embodiment, the sense voltage detection feed 106 may be used as the source of power; however, the minimum voltage levels required provide the ability to simulate a low contact resistance mechanical switch.

The two wire pressure sensing system 100 may further include a voltage limiter 117 to place a bound on the maximum voltage that drives the internal electronic circuits that maintains a low current draw as the voltage of the open circuit increases. In one embodiment, the voltage limiter 117 is a circuit that increases in impedance, and drops the voltage supplied to the energy harvesting conversion circuit 104.

Figure 2:
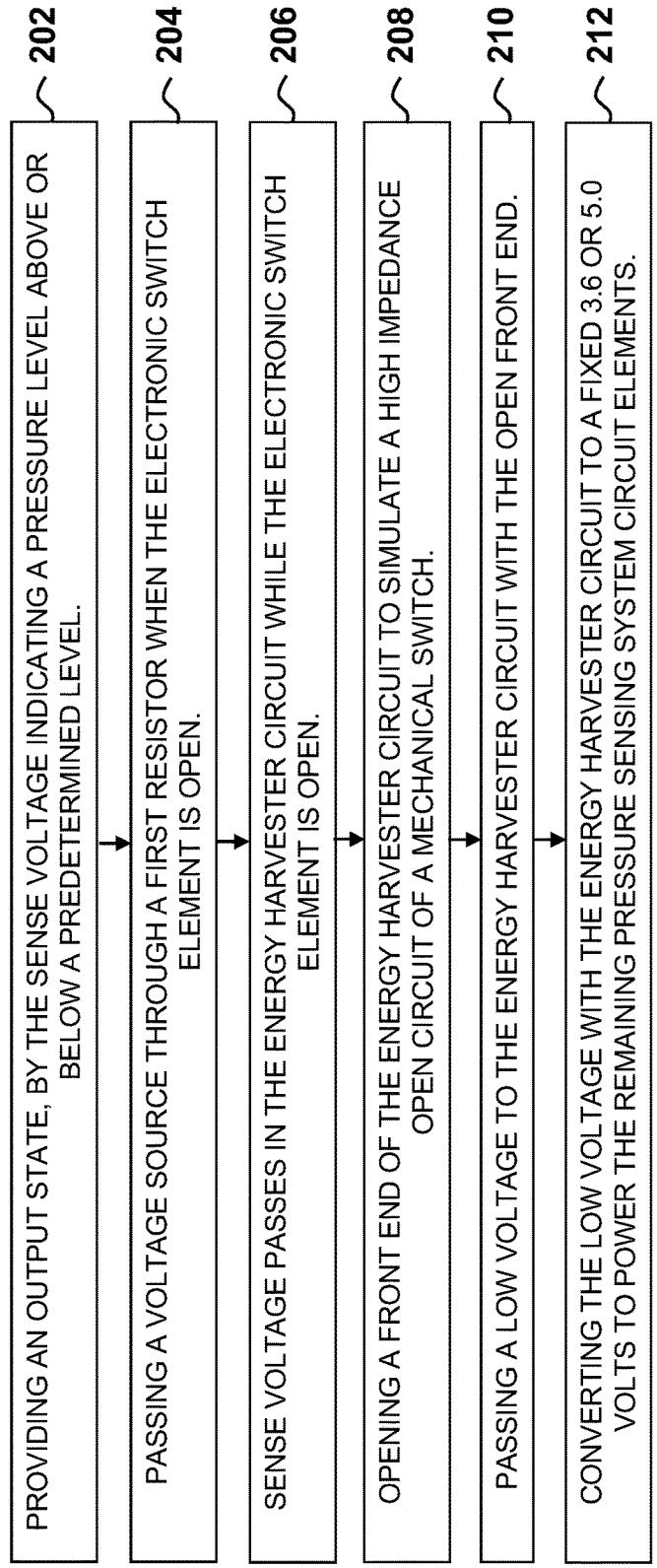
FIG. 2 depicts a flowchart of a process of the pressure sensing system of FIG. 1, according to one embodiment.

With respect to FIG. 2, a flowchart 200 of a process of the pressure sensing system 100 is illustrated. At step 202, a sense voltage source, such as sense voltage detection feed 106 provides an output state indicating a pressure level above or below a predetermined level. In another embodiment, the output state is a different physical quantity, such as temperature, PH, salinity, and the like. When the electronic switch element 102 (e.g., a transistor) is open, a voltage source, such as 28 Volts source 108 passes through the first resistor 114 (with a 3K typical resistance value). This voltage source provides an operating current to the energy harvesting conversion circuit 104 and the switch 102, and draws an insignificant current. The operating current draw being low through resistor 114 drops an insignificant voltage, and sense voltage 106 will then be close to 28 Volts, indicating an open circuit condition.

During the time the electronic switch element 102 is open, a sense voltage 107 (see FIG. 1) of the sense voltage source 108 passes into the energy harvester circuit 104, at step 206. The harvester circuit 104 normally operates over low voltages, such as 20 mv to 5 Volts to produce a regulated output of 3.5 or 5.0 volts. To prevent the internal energy harvesting circuit 104 from experiencing a voltage greater than 5 Volts and from drawing significant current, the energy harvesting circuit 104 has a front end 119 (see FIG. 1) that increases impedance in order to drop the voltage delivered to the energy harvesting device 104. This increasing impedance also provides a high impedance, to simulate a high impedance open circuit of a mechanical switch (step 208). This high impedance circuit, such as a junction gate field-effect (JFET) transistor turns off to pass a low voltage to the energy harvester circuit 104, at step 210. The energy harvester 104 converts this voltage to a fixed 3.6 or 5.0 volts to power the remaining pressure sensing system 100 circuitry, at step 212.

Figure 3:
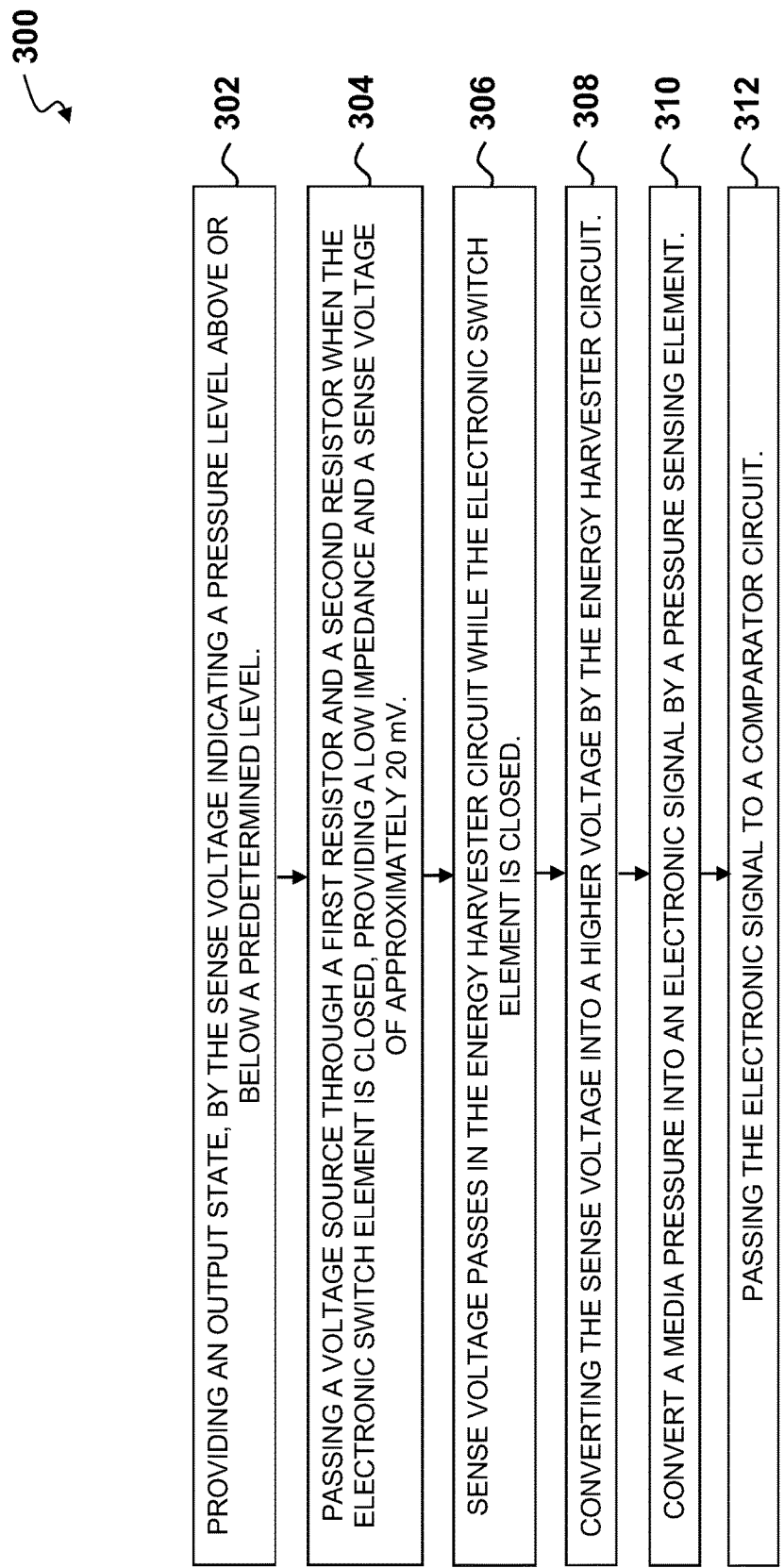
FIG. 3 depicts a flowchart of an alternative process of the pressure sensing system of FIG. 1, according to one embodiment.

With respect to FIG. 3, a flowchart 300 of a process of the pressure sensing system 100 is illustrated. At step 302, the sense voltage source, such as sense voltage detection feed 106 provides an output state (e.g., sense voltage 107) indicating a pressure level above or below a predetermined level. In another embodiment, the output state is a different physical quantity, such as temperature, PH, salinity, and the like. When the electronic switch element 102 (e.g., a transistor) is open, a voltage source, such as 28 Volts form the 28 Volts source 108 passes through the first resistor 114 (with a 3K typical resistance value) and drops an insignificant voltage, since the current draw is small. This normally open condition outputs a voltage of near 28 Volts as referenced to the return.

During the time the electronic switch element 102 is closed, the current flows from the 28 voltage source 108 through the first resistor 114, and through the second resistor 116. In one embodiment, the second resistor 116 is a 2.2 ohm resistor that simulates the closed state of a micro switch. The ratio of the first resistor 114 to the second resistor 116 (e.g. ratio of 3K ohm to 2.2 ohm) provides for a low impedance, and provides a sense voltage approximately in the 20 mV range.

At step 306, the sense voltage 107 is fed from the sense voltage detection feed 106 to the energy harvester circuit 104 (e.g., DC/DC energy harvester circuit), at step 306. In one embodiment, the energy harvester circuit 104 converts this low milli-volt sense voltage 107 into a higher voltage, such as a regulated 3.6 or 5V, at step 308. This unique feature allows the remaining electronic circuitry of the pressure sensing system 100 to operate from a converted 5 Volts or 3.6 Volts regulated rail 121 (see FIG. 1). In one embodiment, a regulated voltage 123 (see FIG. 1) may be used as a reference to determine the switch point of the comparator 110. The regulated voltage 123 is primarily used as the switching point reference; however, the regulated voltage 123 may be further conditioned in the comparator 110 as well (e.g., a voltage divider).

To derive the control signal for the electronic switch 102 and to provide for the logic of switching, the sense element and amplifier circuit 112 and the comparator circuit 110 perform the measurement. A sense element (e.g., a transducer) or amplifier of the sense element circuit 112, with the example of a pressure sensing element (e.g., a Wheatstone bridge), may convert a media pressure (e.g., oil, water, fuel, hydraulic fluid, air, etc.) into an electronic signal, at step 310. This signal may require electronic amplification, filtering, sample and hold, or periodic sampling. The output of the sense element/amplifier, such as signal 109 may be passed to the comparator circuit 110, at step 212.

The electronic comparator circuit 110 may include a hysteresis between ascending voltage and descending voltage. The purpose of this hysteresis, as in a typical mechanical switch version, is to prevent an uncertainty at the switch point that could oscillate, or show an indeterminate value. In one embodiment, the comparator circuit 110 may switch high or low with logic depending on the application (e.g., High pressure=High output or Low pressure=High output) to indicate a pressure threshold has been passed.

Additional circuits may be included for practical purposes, such as a slow turn-on, initial startup circuit, high voltage transient protection (which may clamp to the 28 Volts power supply 108), EMI filter circuits, and/or precision voltage references for increased accuracy.

It is contemplated that various combinations and/or sub-combinations of the specific features and aspects of the above embodiments may be made and still fall within the scope of the invention. Accordingly, it should be understood that various features and aspects of the disclosed embodiments may be combined with or substituted for one another in order to form varying modes of the disclosed invention. Further, it is intended that the scope of the present invention is herein disclosed by way of examples and should not be limited by the particular disclosed embodiments described above.

What is claimed is:

1. A two wire detection circuit powered system comprising:
   an electronic switch circuit configured to sense a pressure level above or below a predetermined value and indicate an open or closed switch condition, wherein the electronic switch circuit provides a contact resistance voltage of about 20 mV in the closed switch condition; and
   an energy harvester configured to convert 20 mV when the electronic switch circuit is in the closed switch condition to an operating voltage between 3.6 Volts and 5 Volts for the electronic switch circuit to operate without an additional power source.

2. The two wire detection circuit powered system of claim 1, further comprising:
   a power supply;
   an external sense resistor connected between the power supply and the electronic pressure switch; and
   a series resistor connected between the external sense resistor and the electronic pressure switch, wherein the series resistor simulates a closed state of a switch, and wherein a ratio of the external sense resistor to the series resistor provides a low impedance to simulate a mechanical two wire sense system while deriving power from a sense circuit.

3. The two wire detection circuit powered system of claim 1, wherein the pressure sensing device is a transducer that converts a pressure into at least one of: a voltage, a capacitance change, and a resistance change.

4. The two wire detection circuit powered system of claim 1, wherein the pressure sensing device is a transducer with an amplifier.

5. The two wire detection circuit powered system of claim 1, wherein the comparator device comprises a preset hysteresis allowing preset hysteresis based on ascending or descending detected pressure levels.

6. The two wire detection circuit powered system of claim 1, wherein turning the electronic pressure switch on outputs a low impedance, and wherein turning the electronic pressure switch off outputs a high impedance while deriving power from a two wire detection system through a sense circuit and low voltage conversion.

7. The two wire detection circuit powered system of claim 1, wherein the electronic pressure switch is a transistor coupled to a two wire sense circuit which also provides the excitation.

8. The two wire detection circuit powered system of claim 1, further comprising:
   a front end of the energy harvesting conversion device, wherein the front end lowers voltage delivered to the energy harvesting conversion device to lower voltage to safe operating levels and simulate an open mechanical switch contact.

9. The two wire detection circuit powered system of claim 8, further comprising:
   a sense voltage detection feed; and
   a voltage limiter, wherein the voltage limiter limits a voltage supplied to the energy harvesting conversion device to lower voltage to safe operating levels and simulate an open mechanical switch contact.

10. The two wire detection circuit powered system of claim 9, wherein the front end and the voltage limiter limit a voltage going into the energy harvester to a maximum of 5 Volts.

11. The two wire detection circuit powered system of claim 1, wherein the electronic switch circuit further comprises:
   a pressure sensing device configured to sense the pressure level and generate a sense element signal indicating the sensed pressure level;
   a comparator device configured to receive the sense element signal from the pressure sensing device and generate a control signal, wherein the control signal indicates the detected pressure level as higher or lower than a preset threshold; and
   an electronic pressure switch configured to receive the control signal from the comparator device, wherein the electronic pressure switch is turned on or off based on the control signal, and wherein power is derived from a sense circuit.

12. The two wire detection circuit powered system of claim 11, wherein the operating voltage from the energy harvester comprises a regulated rail to the comparator device and a regulated voltage to the pressure sensing device.

13. The two wire detection circuit powered system of claim 12, wherein the regulated rail is between 0.5 Volts and 1.5 Volts.

14. The two wire detection circuit powered system of claim 12, wherein the regulated voltage is between 3.6 Volts and 5 Volts.

* * * * *